United States Patent
Pellenc et al.

(10) Patent No.: US 11,384,901 B2
(45) Date of Patent: Jul. 12, 2022

(54) ELECTRIC CUTTING TOOL WITH AUTOMATIC EMERGENCY STOP

(71) Applicant: PELLENC, Pertuis (FR)

(72) Inventors: Roger Pellenc, Pertuis (FR); Bernard Lopez, La Tour d'Aigues (FR)

(*) Notice: Subject to any disclaimer, the term of this patent is extended or adjusted under 35 U.S.C. 154(b) by 171 days.

(21) Appl. No.: 16/646,833

(22) PCT Filed: Nov. 20, 2018

(86) PCT No.: PCT/FR2018/052914
§ 371 (c)(1),
(2) Date: Jul. 15, 2020

(87) PCT Pub. No.: WO2019/102129
PCT Pub. Date: May 31, 2019

(65) Prior Publication Data
US 2020/0347991 A1 Nov. 5, 2020

(30) Foreign Application Priority Data

Nov. 23, 2017 (FR) .................... 17/71255

(51) Int. Cl.
*A01G 3/08* (2006.01)
*H03K 17/96* (2006.01)
(Continued)

(52) U.S. Cl.
CPC ........... *F16P 3/12* (2013.01); *A01G 3/085* (2013.01); *G01V 3/06* (2013.01); *H03K 17/9645* (2013.01)

(58) Field of Classification Search
CPC ........ F16P 3/12; F16P 3/148; H03K 17/9645; A01G 3/085; A01G 3/037; G01V 3/06;
(Continued)

(56) References Cited

U.S. PATENT DOCUMENTS 4,531,287 A * 7/1985 Shibata .................. B26B 19/28
200/600
5,025,175 A 6/1991 Dubois, III
(Continued)

FOREIGN PATENT DOCUMENTS

EP 2490865 A1 8/2012
EP 2825811 A1 1/2015
(Continued)

OTHER PUBLICATIONS

English Translation of the International Search Report for corresponding PCT/FR2018/052914.
(Continued)

*Primary Examiner* — Ghassem Alie
(74) *Attorney, Agent, or Firm* — Egbert, McDaniel & Swartz, PLLC

(57) ABSTRACT

A safety cutting tool has an electrically conductive cutting element, an electrically controlled actuating motor drivingly connected to the cutting element, a gripping handle electrically insulated from the cutting element and adapted to receive a hand of an operator therein, a cutting trigger control electrically insulated from the cutting element and adapted to be actuated by the hand of the operator, and an emergency stop device that is able to respond to a contact of the operator with the cutting element. The emergency stop device includes a first manual contact, electrode and a second manual contact electrode with an electrical monitoring circuit connected thereto.

15 Claims, 2 Drawing Sheets

(51) Int. Cl.
*F16P 3/12* (2006.01)
*G01V 3/06* (2006.01)

(58) Field of Classification Search
CPC .......... B26D 7/24; B27G 19/00; B27G 19/02; B23D 45/06; B23D 47/08; B23D 59/001; B23D 55/08; B27B 13/14; B27B 5/38; B27B 13/16; Y10T 83/089; Y10T 83/04; Y10T 83/088; Y10T 83/7763; Y10T 83/773; Y10T 83/7693; Y10T 83/613; Y10T 83/081; Y10T 83/7788; Y10T 83/8773
USPC .......... 30/228; 83/62, 485, 58, 477.2, 471.1, 83/477.1, 491, 581, 62.1, 781, 473, 468.3, 83/698.11; 340/686.5, 686.6, 562; 144/3.1, 130, 286.5, 287

See application file for complete search history.

(56) References Cited

U.S. PATENT DOCUMENTS

| | | | |
|---|---|---|---|
| 7,365,955 | B2 | 4/2008 | Mather et al. |
| 2002/0017182 | A1* | 2/2002 | Gass ..................... B27G 19/02 83/DIG. 1 |
| 2002/0069734 | A1* | 6/2002 | Gass ..................... B23D 55/08 83/485 |
| 2003/0128116 | A1* | 7/2003 | Ieda ..................... H01Q 1/3283 340/425.5 |
| 2004/0226424 | A1* | 11/2004 | O'Banion .............. B27G 19/02 83/397 |
| 2012/0167732 | A1* | 7/2012 | Gass ..................... B27B 5/38 83/62 |

FOREIGN PATENT DOCUMENTS

| | | |
|---|---|---|
| FR | 2712837 A1 | 6/1995 |
| FR | 2779669 A1 | 12/1999 |
| FR | 2831476 A1 | 5/2003 |
| FR | 2838998 A1 | 10/2003 |
| FR | 2846729 B1 | 2/2005 |
| FR | 2963081 A1 | 1/2012 |
| FR | 3001404 A1 | 8/2014 |
| WO | 2012025456 A1 | 3/2012 |

OTHER PUBLICATIONS

English Translation of the Written Opinion of the ISA for corresponding PCT/FR2018/052914.

* cited by examiner

ELECTRIC CUTTING TOOL WITH AUTOMATIC EMERGENCY STOP

TECHNICAL FIELD

The present invention concerns an electrically controlled safety cutting tool provided with an automatic emergency stop device. The emergency stop device is intended to prevent a serious injury to an operator of the cutting tool in case of unintended contact of the operator with a cutting element of the cutting tool when the tool is in operation. At the very least, the invention aims to limit any injury to be a minor injury.

A serious injury is characterized, for example, with respect to electric pruning shears, by a deep cut, such as the complete severance of a part of an operator's finger. A minor injury, on the other hand, can be compared to a skin scrape of the hand in the brambles capable of causing a light bleeding.

The emergency stop device is considered to be automatic if the emergency stop is triggered without voluntary intervention by the operator, but upon the simple detection of a situation that could cause an injury.

The invention can find applications for various cutting tools, and in particular for portable electric cutting tools with a moving blade, such as pruning shears or shears, or even chainsaws, circular saws, drills or grinders.

STATE OF PRIOR ART

An illustration of the state of the art is given by the following documents:
FR 2712837
FR 2779669
FR 2831476
FR 2838998
FR 2846729
FR 2963081
FR 3001404
EP 2490865
EP 2825811: this document shows pruning shears with a safety system provided with a manual contact electrode on the handle.
U.S. Pat. No. 5,025,175
U.S. Pat. No. 7,365,955
WO 2012/025456: this document shows a chain saw with a capacitive safety system provided with a contact electrode on the handle.

The aforementioned documents concern machines and tools with electric controls provided with an emergency stop device to prevent injuries to an operator. Among these documents are to be found numerous tools such as electric pruning shears held by a single hand for trimming vegetation.

In this example, the operators hold the electric pruning shears in one hand and use their second free hand for handling the already cut or to be cut plant. A risk of injury exists when the hand not holding the pruning shears comes into immediate proximity or into contact with the cutting element during the cut. In the case of pruning shears or scissors, the cutting element presents itself in most cases in the form of a fixed blade or hook, and a pivoting blade. The pivoting blade pivots between an open position and a closed position on the hook, with a shearing effect between the pivoting blade and the hook. The cutting element of certain pruning shears may also have two mobile blades cooperating with each other to achieve the shearing effect when the blades pass from an open position to a closed position.

In the case of drills, grinders, circular or chain saws, the cutting element presents cutting parts in rotation around an axis.

In the case of machine tools such as shears, crushers or circular saws, cutting elements present themselves in the form of cutting parts rotating around an axis or in translatory motion relative to a fixed frame.

Various means are employed to detect the immediate proximity or the contact of the hand with the cutting element. One can distinguish in particular radio-electric means, potential detecting means on the blade, capacitive means or also impedance measuring means.

The known safety devices employ gloves, shoes or also a beacon, electrically connected to the safety device by a communication link. The link may be a wire link or possibly by Hertzian wave.

When gloves are used, the gloves are equipped with electric conductors and their function is to create a measuring circuit between the glove and the cutting element. Similarly, conductive shoes may be used to create a measuring circuit connected to the ground and including the operator's body.

The use of electronic beacons, conductive gloves, conductive shoes or more generally of a conductive item of clothing electrically connected to the cutting tool, serves to detect a contact of the operator with the cutting element. An emergency stop of the cutting operation, in response, for example, to the detection of the contact of the conductive item of clothing with the cutting element, makes it possible to avoid or limit the severity of a possible injury.

The known safety devices do however present a certain number of difficulties or drawbacks for the operator. These include in particular, the following:
- the discomfort caused by wearing conductive clothing, and in particular of conductive gloves,
- the discomfort caused by a wired connection between the conductive clothing and the pruning shears,
- a risk of severing the wired link between the conductive clothing and the pruning shears,
- a risk of injury if wearing the conductive clothing or the detection beacon is forgotten, or if these accessories are not worn properly.
- a risk linked to the failure of the contacts between the safety device and the cutting element. For example, the wear and tear of conductive gloves after too much use, poor maintenance, accidental deterioration, or the deposit of insulating substances on the glove or the cutting element such as sap, oil or grease, risk modifying or even obscuring the signal received by the safety device. This may, at short notice, render the safety device inoperative without the operator being aware of it beforehand.

DISCLOSURE OF THE INVENTION

The purpose of the present invention is to offer a safety cutting tool which does not present any of the aforementioned drawbacks.

In effect, the aim of the invention is to offer a safety cutting tool which does not make use of an electrically conductive item of clothing such as a glove and which does not require wearing a beacon.

The invention proposes a cutting tool including a safety device which simply uses the conductivity of the operator's body in immediate proximity or in contact with it, in order to detect the existence of a contact between the operator and the cutting element, and thereby prevent any risk of injury.

Utilization of the simple conductivity of the human body, measurable notably by its impedance, does however present some difficulties concerning the quality of the electric contact between the operator's body and the safety device or the cutting element. The intrinsic impedance of the human body is in effect of a low value, depending on the operator and not varying significantly. That is not the case of a contact impedance between the operator's body and a conductive part such as, for example, a manual contact electrode or the cutting edge of a conductive cutting blade. This impedance is in fact likely to vary in significant proportions. It may vary depending on the characteristics of the operator's skin, whether the skin is moist or not, the surface characteristics of a manual contact electrode (dimensions, roughness, conductivity, etc.), the climate conditions or contact pressure exerted by the operator.

For example, a hand with dry skin has very low conductivity. Its contact, with low pressure, on a manual contact electrode can generate high contact impedance capable of reaching values of a few hundred thousand Ohm. Conversely, the contact with a moist hand, particularly in a saline atmosphere near the coast, brings a low contact impedance of a few thousand Ohm, or even a few hundred Ohm or just a few Ohm.

The contact of a part of the operator's body with the cutting element may translate into an impedance value of a few Ohm, or even a few hundred Ohm, depending on the contact pressure exerted, if it occurs for example in a very conductive and cutting area such as the edge of the blade of pruning shears. However, the impedance value can be a few hundred Ohms or even a few thousand Ohms or more, if the contact occurs on another part of the cutting element, for example, on the side of a cutting blade having a thin insulating coating.

These hazards can be avoided by using an item of clothing and/or an electrically conductive wired link resulting in a contact impedance varying only over a small range of values. If this is not the case, they must be taken into account so as not to compromise the safety of the cutting tool.

In effect, the simultaneous contact of an operator with a safety device and a cutting element can generate a very large range of possible impedance values between the cutting element and the tool including the safety device. It is not possible, in this case, to reliably establish the risk of an actual contact between the operator and the cutting element.

To overcome these difficulties, the present invention proposes a safety cutting tool including:

an electrically conductive cutting element, an electrically controlled motor for actuating the cutting element, a gripping handle of the cutting tool for the hand of an operator, the gripping handle being electrically insulated from the cutting element, a cutting trigger element operable by the operator's hand grasping the gripping handle, the cutting trigger element being electrically insulated from the cutting element, an emergency stop device responsive to an operator's contact with the cutting element, In accordance with the invention the safety cutting tool is characterized by:

at least one first and at least one second manual contact electrode; the first manual contact electrode and the second manual contact electrode being electrically insulated from each other, and positioned on at least one of the gripping handle of the tool and the cutting trigger element, so as to be touched simultaneously by the operator's hand when he grasps the gripping handle, an electric monitoring circuit including the first manual contact electrode and the cutting element; the electric monitoring circuit is capable of closing upon simultaneous contact of the operator with said first manual contact electrode and the cutting element, an electric generator of a monitoring current in the first electric circuit, a measuring device of a monitoring voltage between the cutting element and the second manual contact electrode, a comparator of at least one monitoring electrical characteristic dependent on the monitoring voltage and a threshold electrical characteristic dependent on an impedance value which increases the human body conduction impedance value; the comparator being connected to the emergency stop device of the actuating motor of the cutting element, so as to cause an emergency stop when the monitoring electrical characteristic crosses the threshold electrical characteristic.

The cutting tool of the invention may be a pruning shears, shear, drill, grinder, circular saw, chain saw or any other tool or machine-tool equipped with a cutting element to be made safe. An implementation of the invention is considered in particular for pruning shears. However, mentioning pruning shears in the description below for the sake of linguistic convenience or simplification, does not prejudge the type of cutting tool.

The gripping handle and the cutting trigger element are considered to be electrically insulated from the cutting element, when at least a part of the handle and the cutting trigger element, and in particular the one holding the manual contact electrodes, could be touched by the operator when he grasps the gripping handle or actuates the cutting trigger element, is electrically insulated from The cutting element. This is also considered to be the case when the handle or the cutting trigger control is connected to the cutting element through the intermediary of an impedance exceeding by several orders of magnitude the value of impedances at issue in the operation of the tool and the emergency stop trigger, for example a value of several million Ohm.

The manual contact electrodes may be metallic, electrically conductive electrodes or formed by electrically conductive surfaces of plastic material of the handle or the trigger. Examples include electrodes made of an intrinsic conductive polymer such as PolyPyrolle, or an extrinsic conductive plastic material charged, for example, with carbon or silver particles.

Although the description refers to two electrodes, a greater number of manual contact electrodes may be used. In the description below a reference to the first or the second manual contact electrode does not prejudge the unique or multiple character of each of these electrodes. The use of several first manual contact electrodes and several second manual contact electrodes may be considered in particular to improve an electrical contact with the operator's hand.

The actuating motor may be an electric motor or possibly a heat engine with electric controls. In a preferred implementation of the invention it is, however, an electric motor. In particular, it may be an electric motor servo-driven by an electronic card capable of controlling rotation functions in one direction and in the opposite direction, and possibly electromagnetic braking functions.

The cutting trigger control may be, for example, a trigger, or component with or without contact, such as an optical sensor measuring the position of the operator's actuating finger. The cutting trigger control is positioned on the gripping handle or in vicinity of the handle, so it can be actuated by the operator's hand grasping the gripping handle. In particular, the cutting trigger element serves to start up the actuating motor and to cause, for example, the opening or the closing of the cutting element of a pruning shears.

The emergency stop device is a device capable of bringing the cutting tool, and in particular the cutting element, to an instant stop to prevent injury to the operator or to avoid an incipient injury from getting worse. The emergency stop may include the immediate triggering of one of the following operations:
- cutoff of the power supply to the actuating motor, in particular its electric power supply, in the case of an electric actuating motor,
- emergency braking acting on the actuating motor and/or directly on the cutting element.
- the triggering of an emergency movement of the cutting tool such as, for example, the opening of the cutting element, in the case of pruning shears or a shear, or a movement to compensate for the kinetic inertia of the mobile parts of the cutting element.

The emergency stop device may particularly include a brake.

It may be an electromagnetic brake acting on the motor, on a flywheel of the motor or directly on the cutting element.

When the actuating motor is an electric motor, the electromagnetic braking, the triggering of an emergency movement, or even the simple cutoff of electric power, may occur simply through the intermediary of the electronic control card of the motor by servo-driving the electric power supply to the phases of the motor. In this case, the emergency stop device includes the electronic motor control card.

The measuring device of a monitoring voltage between the cutting element and the second manual contact electrode is a high impedance measuring device, such as a voltmeter. Its internal impedance is several orders of magnitude higher than the impedances involved in the electric monitoring circuit, so as not to interfere with a current flowing in the electric monitoring circuit. This is, for example, an internal impedance greater than 10 MΩ [sic]. The monitoring voltage is measured relative to the potential of the cutting element which preferably corresponds to the ground potential of the tool. It can also be measured or determined relative to a constant potential in relation to ground or the cutting element.

The monitoring electrical characteristic may be a characteristic that can be expressed in the form of a voltage, a current, an impedance value or even a conductance value. It is based on the monitoring voltage in accordance with the Ohm's law.

The same applies to the threshold characteristic which is based on the human body conduction impedance and in particular a value which increases the human body impedance value. It can also be established in the form of a voltage, a current, an impedance value or a conductance value in application of Ohm's law and an impedance value of the electric circuit.

Different forms of expression of the monitoring electrical characteristic and the threshold electrical characteristic are explained in the description below.

The electric monitoring circuit includes, as previously mentioned, the first manual contact electrode, and the electrically conductive cutting element. It is closed when the operator touches at the same time the first manual contact electrode of the cutting tool and the cutting element.

For the sake of simplification, the operator is considered to be touching the first manual contact electrode with one hand grasping the handle and touching the cutting element with a finger of the other hand, which risks the occurrence of being injured. However, this choice does not imply any limitation with respect to the part of the body that touches the cutting element. The operation and the triggering of the emergency stop device are identical, whatever part of the human body it may be that comes into with the cutting element. This may be a finger, hand, leg or forearm, for example.

Thus, when the operator simultaneously touches the first manual contact electrode and the cutting element, a certain number of impedances find themselves in series in the measuring circuit between the first manual contact electrode and the cutting element. These are:
- contact impedance between the hand and the first manual contact electrode, marked $Z_{M1}$
- impedance of the operator's body, between the hand touching the first manual contact electrode and the finger of the other hand, marked $Z_C$, and
- impedance of the contact between the finger and the cutting element, marked $Z_D$.

Furthermore, in the particular case of pruning shears, it is noted that $Z_V$, is the sum of impedance of the vegetation, for example that of vine tendrils, the contact impedance of the finger or more generally of the hand, on the vegetation or an object held by the free hand of the operator and cut by the cutting element. The object held may be, if applicable, a trellis wire. For other tools the variable $Z_V$ characterizes the impedance of the cut material associated with the contact of the finger with this material, assuming that this material is touched by the operator's free hand.

By ignoring the proper impedance values of the first manual contact electrode and the cutting element, the total impedance marked $Z_T$ of the electric monitoring circuit can take three values:
- an infinite value $Z_T=\infty$, when the cutting element is not touched,
- a value $Z_T=Z_{M1}+Z_C+Z_D$, when the finger touches the cutting element,
- a value $Z_T=Z_{M1}+Z_C+Z_V$, when a material held by the free hand touches the cutting element.

The order of magnitude of the impedance value $Z_C$ of the operator's body, between his first hand grasping the handle and his finger of the other hand that could touch the cutting element, can easily be evaluated. This is the conductivity of the human body whose impedance has a value of less than ten thousand Ohm, and in any case of an order of magnitude of a thousand Ohm.

The value of the impedance $Z_{M1}$ of contact of the hand with the first manual contact electrode, as well as, the contact impedance $Z_D$ between the finger and the cutting element, or the impedance $Z_V$ including the intermediary impedance of a material in contact with the cutting element can present great variability and are most often much greater than the value of impedance of the operator's body, particularly in case of weak contact pressure with a part of the skin of the hand having a low conductivity.

In the following description, reference is only made to the direct contact of the finger with the cutting element. In effect, the situation of contact of the finger with an intermediary material does not create a risk for the operator. It may possibly trigger the emergency stop device when an impedance value $Z_V$ is close to $Z_D$, which is to say when the intermediary material is of good electric conductivity.

However, when the contact of the finger with the cutting element is close to risking an injury, the various tests conducted by the applicant show that the value of the contact impedance of the finger $Z_D$, can be evaluated as being of the same order of magnitude or even to become lower than the impedance value $Z_C$ of the operator's body. In effect, the finger presents significant elasticity when the blade comes into contact with it, and it is only with significant pressure that the blade can first cut the epidermis of the finger, causing a minor injury before resulting in a severe injury as it pursues the cut. In the case of minor gash, such as a scrape on the epidermis, the value of the contact impedance $Z_D$ between the cutting element and the subcutaneous parts of the finger is then significantly lower than the value of the impedance of the human body $Z_D$.

It is estimated that the value of the contact impedance at the cutting element in case of a serious contact is lower than the value of impedance of the human body. Detection of an impedance in the order of magnitude of the impedance of the human body allows identification with a high degree of probability of an instantaneous and not intended contact of the operator with the cutting element.

The same is not the case for the contact impedance $Z_{M1}$ between the operator's hand and the first manual contact electrode, the value of which can vary in more significant proportions, and actually mask the occurrence of a contact between the operator's finger and the cutting element.

The measuring device of the invention makes it possible to dispense with the contact impedance $Z_{M1}$ between the operator's hand and the first manual contact electrode. This is achieved by measuring a voltage on the second manual contact electrode.

The second manual contact electrode is connected to the first manual contact electrode through the intermediary of the operator's hand which seizes the handle and which by this fact touches the first and the second manual contact electrode. The manual contact electrodes are thus connected by two potentially high impedances in series. This is the contact impedance of the hand with the first manual contact electrode and of an impedance $Z_{M2}$ of contact of the hand with the second manual contact electrode.

Thus, it is also considered that the second manual contact electrode is connected to the impedance of the operator's body through the impedance of hand contact with the second manual contact electrode. Because of the high internal impedance of the voltage measuring device the voltage measured on the second manual contact electrode, or more precisely the potential difference between this electrode and the ground of the tool is essentially equal to a potential difference $V_C$ which would be measured on an internal imaginary point of the operator's hand marked C and the cutting element connected to the ground of the tool. In effect, a zero or almost zero current flows between this imaginary internal point and the second manual contact electrode ensuring the quasi-equality of the potentials $V_{E2}$ and $V_C$, these two voltages can be considered as constituting the monitoring voltage.

The electric generator of a monitoring current has the function of circulating in the monitoring circuit a monitoring current $I_S$, when the monitoring circuit is closed, which is to say during a contact, direct or indirect, of the operator with the cutting element.

The electric generator may include, for example, a current source. It may also include a voltage source. The current source or the voltage source may be connected in series in the monitoring circuit.

The electric generator of the monitoring current may have an independent power supply, for example, an electric battery. It may also be supplied with energy from an electric power source, for example, a power supply battery of a cutting tool, provided that the cutting tool is equipped with an electric drive motor.

When the electric generator includes a current source, the intensity of the current when the circuit is closed, is known. It then corresponds to the intensity of the monitoring current $I_S$.

The cutting tool may also include, in series in the electric circuit an electric adjustment impedance presenting a predetermined and known impedance value $Z_1$ as well as a measuring device of a voltage $V_1$ at the terminals of the electric adjustment impedance. The measurement of this voltage makes it also possible to know the intensity of the monitoring current $I_S$. In effect, the monitoring current $I_S$ is equal to the ratio of the voltage measured at the terminals of the electric adjustment impedance on the value of electric adjustment impedance:

$$I_S = V_1/Z_1$$

The selection of the value of adjustment impedance $Z_1$, is likely to influence the intensity of the current flowing in the monitoring circuit. It is however not critical, its function being essentially to determine the intensity of the monitoring current. For example, the value of the adjustment impedance can be chosen between 1Ω and 200 KΩ.

The measuring device is, for example, a voltmeter, and in particular a voltmeter integrated in an electronic card which also includes the comparator.

It is thus possible to know the cumulated impedance Z of the operator's body based on the measurement $V_{E2}$ and the monitoring current Is circulating in the electric monitoring circuit.

One has:

$$Z = Z_C + Z_D \text{ and}$$

$$V_{E2} = I_S \times Z$$

Which is:

$$Z = V_{E2}/I_S$$

This impedance can be compared to an impedance value of threshold impedance $Z_{threshold}$ which increases the impedance value $Z_C$ of the human body, and preferably increasing the impedance value $Z_C$ of the human body by a factor or 3.

In particular, the value that increases the impedance can be chosen to be equal to 20 kΩ and preferably greater than 100 kΩ. It also takes into account a value of contact between the operator's finger and the cutting element that is unlikely to create an injury during the operation of the cutting element.

According to a particular implementation of the invention, the monitoring electrical characteristic can be a voltage dependent on the monitoring voltage, and the threshold electrical characteristic may be a threshold voltage dependent on the impedance value $Z_{threshold}$ which increases the human body conduction impedance value and the monitoring current. In particular, the monitoring electrical characteristic may be equal to the monitoring voltage $V_{E2}$ and the threshold electrical characteristic may be equal to a voltage $V_{threshold}$ equal to the product of the impedance value which increases the human body conduction impedance value and the monitoring current.

In this case $V_{E2}$ and $V_{threshold}$ are compared to each other.

where $V_{threshold} = Z_{threshold} \times I_S$

When $V_{E2} > V_{threshold}$, the operation of the tool is normal.

When $V_{E2} < V_{threshold}$ or $V_{E2} = V_{threshold}$, the emergency stop device is actuated.

According to another particular implementation possibility, the monitoring electrical characteristic may be an impedance value dependent on the monitoring voltage and the monitoring current, and the threshold characteristic may be an impedance value dependent on the impedance value $Z_{threshold}$ which increases the human body conduction impedance value.

In particular, the monitoring electrical characteristic may be equal to an impedance Z equal to the ratio of the monitoring voltage, and the monitoring current, and the threshold characteristic may be equal to the impedance value $Z_{threshold}$ which increases the human body conduction impedance value.

In this case when $Z > Z_{threshold}$, the operation of the tool is normal.

However, if $Z < Z_{threshold}$ or $Z = Z_{threshold}$, the emergency stop device is actuated.

Other characteristics of monitoring and threshold such as refined functions of the aforementioned variables may also be retained. It is also possible to compare conductances.

The comparison between the impedance Z and the impedance $Z_{threshold}$ or, as mentioned previously, the comparison of the monitoring voltage $V_{E2}$ with a voltage $V_{threshold}$, or also, more generally, the comparison of another monitoring electrical characteristic, dependent on the monitoring voltage, with a threshold electrical characteristic, dependent on an impedance which increases the human body impedance value, is performed by the comparator.

To this effect, the value $Z_{threshold}$, the value $V_{threshold}$, or more generally the value of the threshold electrical characteristic dependent on an impedance which increases the human body impedance value, can be stored in a memory connected to the comparator. The threshold values contained in the memory may be set during the manufacture of the tool. Access to the memory can also be provided in order to modify the threshold values in order to modify, if needed, the sensitivity of the actuation of the emergency stop device.

When the electric generator includes a current source, the latter can be connected in parallel to the adjustment impedance, connected in series in the electric monitoring circuit. As mentioned previously, Ohm's law can then be used to determine the Is value of the current flowing in the monitoring circuit.

The electric generator may be an alternating current generator or a direct current generator. An alternating current generator presents, for example, an operating frequency of 10 kHz. The use of an alternating monitoring current enables the device to operate when the conductive cutting element is covered with a thin coating of electric insulating material, for example, an anticorrosive coating or an anti-fouling layer. For example, the blade of pruning shears can be covered with a thin PTFE coating in order to facilitate its slide on the counter blade during the cut while preventing its corrosion. In fact, in this case, the contact between the operator's finger and the cutting element may be a primarily a capacitive contact. It should be noted here, however, that the cutting edge of the blade is free of this type of coating, as the blade edge is too tapered for such a protective coating to adhere to it.

Furthermore, the cutting tool may include a monitoring device of an electrical potential of the cutting element. The electrical potential monitoring device is connected to the emergency stop device in order to cause an emergency stop when the electrical potential of the cutting element is outside a setpoint of range. The monitoring device prevents situations in which the setting of the electrical monitoring characteristics would be affected by a modified potential of the cutting element, and in particular by a non-zero potential of the cutting element.

This is because, as already mentioned, the cutting element is preferably connected to a ground potential of the tool.

A modification of the potential of the cutting element can result, for example, during an unexpected contact of the cutting element with a live metallic conductor, such as an electric fence, for example.

Additionally, the cutting tool may include a ground impedance, of a value exceeding by several orders of magnitude the impedance value which increases the human body impedance value, the ground impedance connecting electrically the second manual contact electrode to the cutting element. In this case, the cutting tool can be also configured to cause either an emergency stop or a deactivation when the monitoring voltage measured by the measuring device is zero. The ground impedance prevents a floating potential of the second manual contact electrode. Its value is very high, for example, several million Ohms, so that no significant current is introduced into the second manual contact electrode, and thus does not affect the measurement of the monitoring voltage. Furthermore, because of the ground impedance, it is possible, in the absence of contact of the hand simultaneously on the first and the second manual contact electrode, to have a monitoring voltage of zero at the second electrode. The measurement of a zero voltage $V_{E2}$ enables, as indicated above, activation of the emergency stop device, or a simple deactivation to inhibit the use of the tool. Thus, an operator who would not, during a cut, touch the second electrode or who would touch it with an insulating glove for example, would not be able to operate the tool, since the means of activation of the emergency stop device are then inoperative to detect a contact risk of the finger with the cutting element.

It should be noted that the operator may, as needed, have to wear electrically conductive gloves, especially to protect himself from the cold. However, it is important that the contact of the hand with the glove does not generate significant variations of impedance, and clearly above the variations of a direct contact of the hand with the manual contact electrode.

Other characteristics and advantages of the invention will become clear from the following description in reference to the figures of the drawings. This description is given for purely illustrative purposes and is not limiting.

BRIEF DESCRIPTION OF THE FIGURES

Identical or similar parts of FIGS. 1 and 2 have the same numerical references so as to facilitate the transfer of one figure to the other and so as to repeat its description.

DETAILED DESCRIPTION OF
IMPLEMENTATIONS OF THE INVENTION

Figure 1:
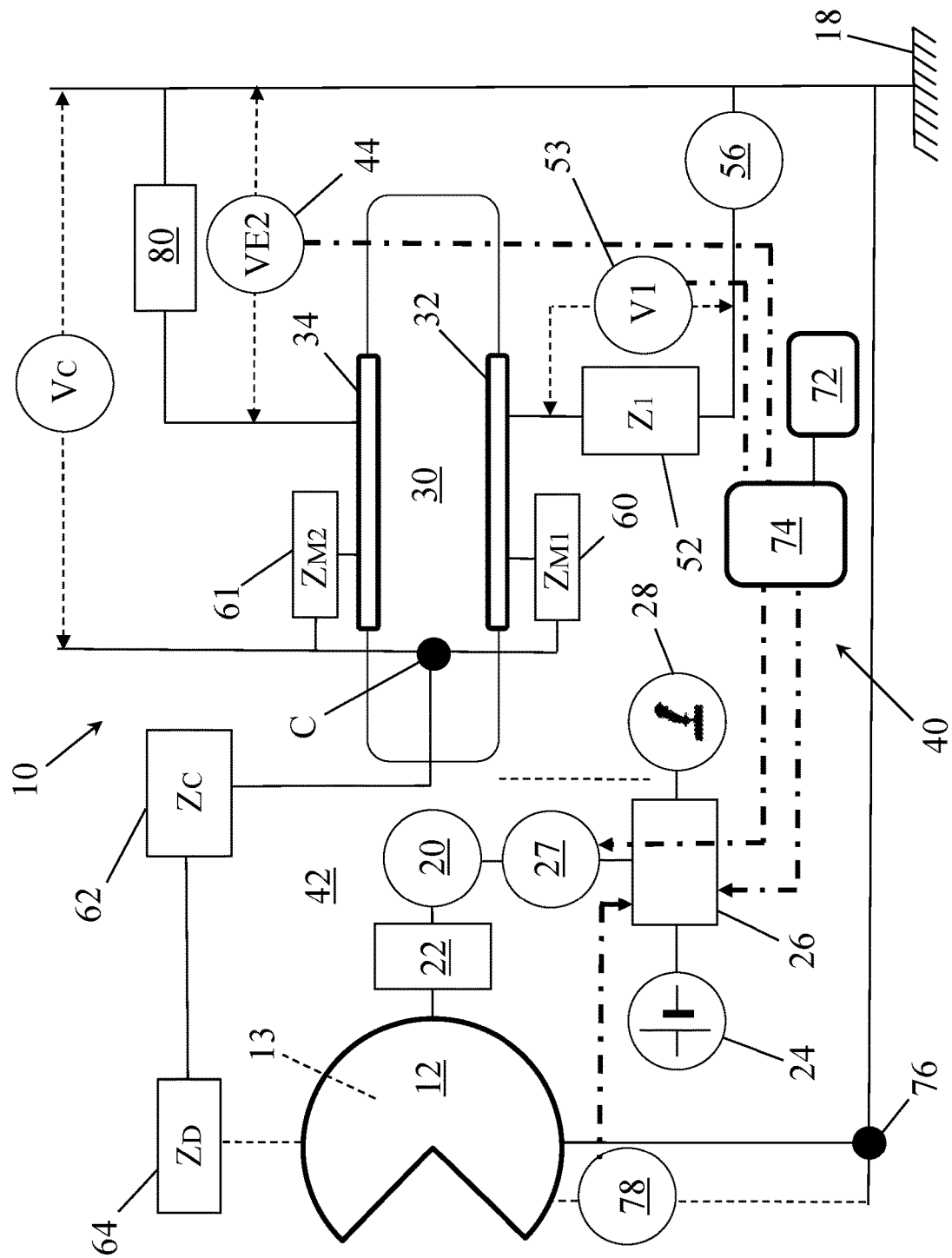
FIG. 1 is a simplified schematic representation of the main characteristics and functions of a cutting tool in accordance with the invention.

FIG. 1 shows schematic diagram of a cutting tool 10 provided with a cutting element 12.

The cutting element 12 is electrically connected to the ground potential 18 of the tool.

The cutting tool also includes an electric motor 20 mechanically connected to the cutting element 12, by a transmission mechanism 22. The transmission mechanism transmits to the cutting element the mechanical energy supplied by the motor. It drives the cutting element in a pivoting movement, a circular rotational movement or a translatory movement, depending on the type of the cutting element.

The electric motor 20 is associated with an electric power supply 24 and an electronic control card 26 of the motor. The electronic control card 26 can receive signals from a cutting trigger element 28 that is activated by the hand of an operator grasping a gripping handle 30 of the cutting tool 10. The cutting trigger element 28, for example a trigger, is positioned in proximity of the gripping handle 30, so it can be actuated by the hand grasping the handle.

The gripping handle 30 is made of an insulating plastic material and hence electrically insulated from the cutting element. It is also provided with a pair of manual contact electrodes 32 and 34 positioned respectively on two essentially opposite parts of the handle. The manual contact electrodes are metallic electrodes or electrodes in a conductive plastic material with which the operator's hand necessarily comes into contact when the pruning shears are grasped by their handle. They are electrically insulated from each other and are electrically insulated from the cutting element 12. Either the first or the second electrode may also be positioned on the trigger of the cutting trigger element, actuated by the hand grasping the handle.

An emergency stop device 40 of the electric motor 20 of the pruning shears is governed by an electric monitoring circuit 42. The electric monitoring circuit 42 includes components of the cutting tool but may also include parts of the body of a human using the pruning shears 10. The electric circuit 42 particularly includes in series, an adjustment impedance 52, the first manual contact electrode 32, the cutting element 12 and an electric generator 56 for a monitoring current. The electric generator is for example a source of voltage, for example an electric battery, or a source of current. The adjustment impedance may be formed by one or several electrical components with a known electrical impedance value. It may be included in the electric generator 56. It is, for example, an electric resistance with a value, for example, of 100 kΩ. However, its value is not critical. It may range, for example, from 1Ω to 200 kΩ. A measurement of the voltage $V_1$ at the terminals of the adjustment impedance can be used to determine the monitoring current Is flowing in the monitoring circuit.

The adjustment impedance is not necessary if the electric generator 56 includes a current source which directly generates a current of defined value $I_S$, when the monitoring circuit 42 is closed.

In the absence of contact with an operator, the electric monitoring circuit 42 is normally an open circuit and therefore has quasi-infinite overall impedance and a current of zero.

When an operator seizes the handle, his hand comes into contact with the manual contact electrodes and thus with the first manual contact electrode 32. The first electric circuit 42 remains open.

However, when the operator also touches the cutting element 12, for example with a finger of his free hand, he closes the electric monitoring circuit 42. In this case, the adjustment impedance 52 finds itself in series successively with the first manual contact electrode, a contact impedance 60 of the operator's hand with the first manual contact electrode 32, an impedance 62 of the operator's body, a contact impedance 64 of the finger with the cutting element, and, finally the cutting element 12.

The values of the contact impedance 60 of the hand, the impedance 62 of the body and the contact impedance 64 of the finger with the cutting element are noted $Z_{M1}$, $Z_C$ et $Z_D$ respectively.

Thus, when the first circuit is closed, a total impedance $Z_T$ is such that:

$$Z_T = Z_1 + Z_{M1} + Z_C + Z_D$$

The impedance of wiring and the cutting element are ignored here. Also ignored is the impedance of the electric generator 56 which is considered here to be a source of voltage.

When the electric monitoring circuit is closed, the generator 56 causes an Is monitoring current to flow in the circuit.

The value of the current Is can be predefined by the current generator when it includes a current source. It can also be predetermined based on a voltage measurement made on the terminals of the adjustment impedance 52 when the generator includes a voltage source, for example. Measurement of voltage $V_1$ at the terminals of the adjustment impedance 52, of value $Z_1$, is taken by an integrated voltmeter 53.

A voltage measuring device 44, for example another integrated voltmeter, is connected between the ground 18 of the cutting tool 10 and the second manual contact electrode. It measures a potential $V_{E2}$, or more precisely a monitoring voltage $V_{E2}$ between the ground 18 and the second manual contact electrode 34.

The monitoring voltage $V_{E2}$ as well as the voltage delivered by the integrated voltmeter 53 are supplied to a digital management unit 74. The digital management unit, for example a microcontroller, or a dedicated integrated circuit, allows various operations to be performed.

A first operation consists of calculating the monitoring current Is by performing a ratio $V_1/Z_1$.

A second operation may consist of calculating an impedance value Z based on the monitoring voltage and the monitoring current. By referring to the preceding description, it is recalled that:

$$Z = Z_C + Z_D = V_{E2}/I_S.$$

Finally, and mainly, the digital management unit 74 constitutes a comparator.

It can particularly be used to compare the impedance value Z to the threshold value $Z_{threshold}$ which increases the human body impedance value. It can also be used to compare the monitoring voltage $V_{E2}$ to the threshold voltage $V_{threshold}$ such as $V_{threshold} = Z_{threshold} \times I_S$.

When the voltage drops below the voltage threshold value or the impedance drops below the impedance threshold value, the threshold electrical characteristic is respectively crossed and the emergency stop is actuated.

Comparisons can be made for other parameters depending on the aforementioned parameters and also be calculated by the digital management unit 74. For example, it is possible to compare conductances rather than impedances.

Following the comparison, and when the threshold electrical characteristic has been crossed, by higher or lower values depending on the characteristic chosen, the emergency stop device 40 is triggered.

The electrical threshold characteristics used by the comparator of the digital management unit, for example the values $V_{threshold}$ or $Z_{threshold}$, can be stored in a memory 72 associated with a digital management unit 74.

In the example of FIG. 1, the emergency stop device includes the electronic control card 26 of the electric motor. The electronic control card 26 receives the emergency stop signal as indicated by a dot-and-dash line. In this case, the motor electronic control card is configured to actuate a movement of the motor itself to counteract the movement of the cutting element and/or to cause an electromagnetic braking of the motor and the cutting element by using the inductive circuits of the electric motor.

This results in an almost instantaneous stop of the movement of the cutting tool.

After the cutting tool has stopped, the electric power supply can also be cut. It can be effectuated by a switch 27, and in particular a transistor switch, servo-driven by the digital management unit 74.

It should be noted that the digital management unit 74, and in particular the comparator which it constitutes, as well as the electronic control card 26 of the actuating motor, can be produced in the form of a single integrated component.

Reference 80 designates a ground impedance. In the example shown in FIG. 1, this is an electric resistance of more than 1 MΩ connected between the second manual contact electrode 34 and the ground 18 of the cutting tool. It prevents a floating voltage of the second manual contact electrode. It is also capable of setting the voltage of the second manual contact electrode at a value of zero when the second manual electrode is not in contact with the operator's hand.

Measurement of a monitoring voltage of zero by the voltage measuring device 44 can thus be exploited by the digital management unit 74 to inhibit the operation of the tool or to cause an emergency stop. In the example shown in the figure, the electric power supply to the actuating motor 20 can simply be inhibited if the measurement of the monitoring voltage is zero.

This makes it possible, for example, to prevent the operation of the tool when it is being held by an operator wearing insulating gloves that would prevent the detection of a contact with the cutting element.

Almost no current flows through the impedance to ground or the part of the operator's hand in contact with the second manual contact electrode. Thus, the potential $V_{E2}$ measured on the second manual contact electrode is quasi-identical to a potential $V_C$ which would be measured between an imaginary point C inside the body of the operator grasping the handle 30 and the cutting element, and therefore the ground of the tool.

Reference 76 designates a control electrode electrically connected to the cutting element 12. It is provided to allow an emergency stop test without touching the cutting element. In fact, it suffices for the operator grasping handle 30 and simultaneously touching the control electrode 76 with his free hand to cause an emergency stop. The electronic control card 26 can possibly be configured to request such a periodic control operation, so as to ensure the proper functioning of the emergency stop device.

A monitoring circuit 78 of the potential of the cutting element is also provided. It is built around a voltmeter and is also connected to the electronic control card 26 of the electric motor 20 to cause an emergency stop when an electric potential of the cutting element 12 becomes different from a set value. In the example of implementation shown, it is checked that the electrical potential of the cutting element is at the ground potential of the tool. The voltmeter can be an integrated component being part of the same electronic card as the digital management unit.

Figure 2:
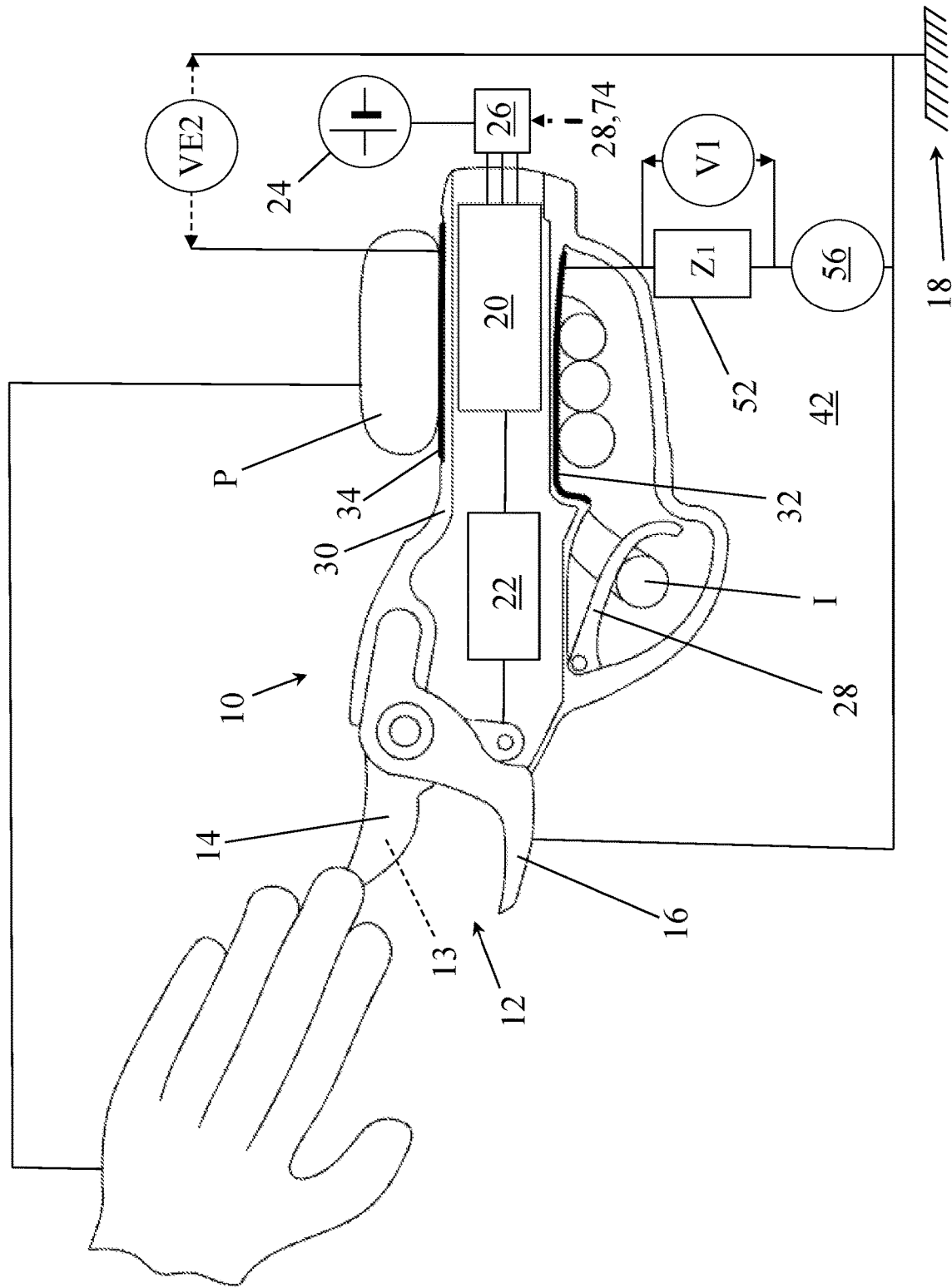
FIG. 2 is a simplified schematic representation of a pruning shears in accordance with the invention.

FIG. 2 shows a pruning shears, with a partial cutaway showing the electric drive motor for the cutting element 12, as well as the transmission mechanism 22 between the motor 20 and a mobile blade 14 of the cutting element 12.

The cutting element 12 includes, in the case of a pruning shears, a fixed blade or hook 16, and a mobile blade 14, moved by the electric motor 20 and closing on the fixed blade following a request by the cutting trigger control 28 which is here a trigger. A signal of the trigger is directed towards the symbolically represented motor control card 26.

FIG. 2 illustrates the contact of the hand with the first and the second manual contact electrode 32 and 34 when the operator grasps the gripping handle 30 for a functional utilization of the pruning shears. It can be observed that the fingers, specifically the middle, ring and little fingers, come into contact with the first manual contact electrode 32 and therefore with the electrical monitoring circuit. The first manual contact electrode 32 is here positioned on a lower part of the gripping handle 30 in an operating position of the pruning shears.

The palm P of the hand comes into contact with the second manual contact electrode 34 positioned here on an upper part of the gripping handle 30.

The forefinger I of the hand is free to actuate the trigger 28.

The free hand of the operator is shown in a position where one finger comes into contact with the cutting element. The hand holding the gripping handle of the pruning shears 10 and the hand coming into contact with the cutting element are connected by a drawn line symbolizing the human body.

The electronic control card 26 of the electric motor is connected to the electric motor so as to control the electric power supply of the different phases of the motor. It can be used for controlling the rotation of the motor in a direction causing the closing of the mobile blade 14 on the hook 16. It can also be used, during an emergency stop, in an inverse direction of rotation, causing the opening of the cutting element, and counteracting its closing. Finally, it can be used as an electromagnetic brake, for example, by short-circuiting the motor phases.

The electronic control card is also connected to an electric power supply 24, such as, for an example, an electric battery carried on the operator's back.

FIG. 2 also shows the monitoring voltage $V_{E2}$ measured between the ground of the pruning shears and the second manual contact electrode 34.

Reference 13 indicates a thin anticorrosive and/or electrically insulating coating such as a PTFE coating (Polytetrafluoroethylene) which may be able to cover the blades 14, 16 of the pruning shears. The use of such insulating coating does not interfere with the operation of the tool of the invention and does not interfere, in particular, with the actuation of the emergency stop device when the electric generator 56 is an alternating current generator. In effect, an alternating monitoring current can flow in the case of contact of the operator's finger with blades 14, 16 of the pruning shears, in spite of the electrically insulating coating. In this case, the impedance $Z_D$ of the finger contact with the cutting tool presents a capacitive component.

The invention claimed is:
1. A safety cutting tool comprising:
an electrically conductive cutting element;
an electrically controlled actuating motor drivingly connected to said electrically conductive cutting element;

a gripping handle adapted to receive a hand of an operator, said gripping handle being electrically insulated from said electrically conductive cutting element;

a cutting trigger control adapted to be activated by the hand of the operator, said cutting trigger control being electrically insulated from said electrically conductive cutting element;

an emergency stop device adapted to respond to a contact of the operator with said electrically conductive cutting element, said emergency stop device comprising:

at least one first manual contact electrode;

at least one second manual contact electrode, said at least one first manual contact electrode and said at least one second manual contact electrode being positioned on either said gripping handle or said cutting trigger control, said at least one first manual contact electrode and said at least one second manual contact electrode adapted to be touched simultaneously by the hand of the operator when the hand of the operator grasps said gripping handle;

an electrical monitoring circuit connected to said at least one first manual contact electrode and said electrically conductive cutting element, said electrical monitoring circuit adapted to close upon a simultaneous contact of the operator with said at least one first manual contact electrode and with said electrically conductive cutting element;

an electrical generator connected to said electrical monitoring circuit and adapted to monitor a current in said electrical monitoring circuit; and a measuring device connected to at least one of said electrically conductive cutting element and said at least one second manual contact electrode and adapted to monitor voltage therebetween; and a comparator connected to said emergency stop device, said comparator adapted to compare at least one monitored electrical characteristic dependent on the monitor voltage and a threshold electrical characteristic dependent on an impedance value, said comparator causing said emergency stop device to cause an emergency stop of said electrically controlled actuating motor when the at least one monitored electrical characteristic crosses the threshold electrical characteristic.

2. The safety cutting tool of claim 1, wherein the at least one monitored electrical characteristic is a voltage dependent on the monitor voltage, the threshold electrical characteristic being a threshold characteristic dependent on the impedance value and a monitored current.

3. The safety cutting tool of claim 2, wherein the at least one monitored electrical characteristic is the monitor voltage, the threshold electrical characteristic being equal to a product of the impedance value and the monitored current.

4. The safety cutting tool of claim 1, wherein the at least one monitored electrical characteristic has an impedance value dependent on the monitor voltage and a monitored current, the threshold characteristic being the impedance value.

5. The safety cutting tool of claim 1, wherein the at least one monitored electrical characteristic is equal to a ratio of the monitor voltage and a monitored current, the threshold characteristic being equal to the impedance value.

6. The safety cutting tool of claim 1, wherein said electrical generator is an alternating current generator.

7. The safety cutting tool of claim 1, wherein said electrical generator has a current source.

8. The safety cutting tool of claim 1, wherein said electrical generator has a voltage source.

9. The safety cutting tool of claim 1, wherein said electrical monitoring circuit has an electrical adjustment impedance in, series therewith so as to present a predetermined impedance value and another measuring device that measures a voltage on terminals of the electrical adjustment impedance.

10. The safety cutting tool of claim 9, wherein a current source is connected in parallel with the electrical adjustment impedance.

11. The safety cutting tool of claim 1, further comprising:
a monitoring device that monitors an electrical potential of said electrically conductive cutting element, said monitoring device being connected to said emergency stop device so as to cause an emergency stop when electrical potential of said electrically conductive cutting element is beyond a desired range.

12. The safety cutting tool of claim 1, wherein said electrically conductive cutting element is connected to a ground potential.

13. The safety cutting tool of claim 1, wherein said electrically controlled actuating motor is a heat engine.

14. The safety cutting tool of claim 1, wherein said electrically controlled actuating motor is an electric motor, said emergency stop device having a electric card for a servo-driven motor.

15. The safety cutting tool of claim 1, wherein a grounding impedance is electrically connecting said at least one second manual contact electrode to said electrically conductive cutting element, the ground impedance having a value greater than the impedance value, the grounding impedance adapted to cause an emergency stop or a deactivation when the monitor voltage of said measuring device is zero.

* * * * *